United States Patent
Doornbos et al.

(10) Patent No.: US 9,412,871 B2
(45) Date of Patent: Aug. 9, 2016

(54) FINFET WITH CHANNEL BACKSIDE PASSIVATION LAYER DEVICE AND METHOD

(71) Applicant: Taiwan Semiconductor Manufacturing Company, Ltd., Hsin-Chu (TW)

(72) Inventors: Gerben Doornbos, Leuven (BE); Mark van Dal, Heverlee (BE); Georgios Vellianitis, Heverlee (BE); Blandine Duriez, Brussels (BE); Krishna Kumar Bhuwalka, Leuven (BE); Richard Kenneth Oxland, Brussels (BE); Martin Christopher Holland, Leuven (BE); Yee-Chaung See, Hsin-Chu (TW); Matthias Passlack, Huldenberg (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 103 days.

(21) Appl. No.: 13/791,325

(22) Filed: Mar. 8, 2013

(65) Prior Publication Data
US 2014/0252478 A1   Sep. 11, 2014

(51) Int. Cl.
*H01L 29/78* (2006.01)
*H01L 29/66* (2006.01)
*H01L 29/10* (2006.01)

(52) U.S. Cl.
CPC .......... *H01L 29/785* (2013.01); *H01L 29/1054* (2013.01); *H01L 29/66795* (2013.01)

(58) Field of Classification Search
CPC .................. H01L 29/785; H01L 29/66795
USPC .................. 257/347, 157, 353, 354
See application file for complete search history.

(56) References Cited

U.S. PATENT DOCUMENTS 6,724,008 B2 *   4/2004   Fitzgerald ........................ 257/19
7,569,869 B2 *   8/2009   Jin et al. ........................ 257/190
(Continued)

FOREIGN PATENT DOCUMENTS

JP    2013046065     3/2013
KR   20090076972    7/2009
(Continued)

OTHER PUBLICATIONS

EPO bibiligraphic information.*
(Continued)

*Primary Examiner* — Tom Thomas
*Assistant Examiner* — Vincent Wall
(74) *Attorney, Agent, or Firm* — Slater Matsil, LLP

(57) ABSTRACT

A FinFET with backside passivation layer comprises a template layer disposed on a substrate, a buffer layer disposed over the template layer, a channel backside passivation layer disposed over the buffer layer and a channel layer disposed over the channel backside passivation layer. A gate insulator layer is disposed over and in contact with the channel layer and the channel backside passivation layer. The buffer layer optionally comprises aluminum and the channel layer may optionally comprise a III-V semiconductor compound. STIs may be disposed on opposite sides of the channel backside passivation layer, and the channel backside passivation layer may have a top surface disposed above the top surface of the STIs and a bottom surface disposed below the top surface of the STIs.

15 Claims, 5 Drawing Sheets

(56) References Cited

U.S. PATENT DOCUMENTS

| | | | |
|---|---|---|---|
| 7,799,592 B2* | 9/2010 | Lochtefeld | 438/44 |
| 8,283,653 B2* | 10/2012 | Pillarisetty et al. | 257/20 |
| 2008/0116485 A1 | 5/2008 | Hudait et al. | |
| 2008/0315256 A1* | 12/2008 | Ohta et al. | 257/194 |
| 2009/0001350 A1* | 1/2009 | Hudait et al. | 257/14 |
| 2011/0024794 A1* | 2/2011 | Ko | H01L 29/66795 257/190 |
| 2011/0121266 A1* | 5/2011 | Majhi et al. | 257/24 |
| 2011/0260282 A1* | 10/2011 | Kawasaki | H01L 21/76229 257/506 |
| 2013/0043536 A1 | 2/2013 | Rahim et al. | |
| 2014/0001519 A1* | 1/2014 | Dewey et al. | 257/288 |

FOREIGN PATENT DOCUMENTS

| | | |
|---|---|---|
| KR | 101401274 | 5/2014 |
| WO | 2014133293 | 9/2014 |

OTHER PUBLICATIONS

Blum, O., "Wet thermal oxidation of AlAsSb lattice matched to InP for optoelectronic applications," Applied Physics Letters, May 1996, 4 pages, vol. 68, Issue 22.

Radosavljevic, M. "High-Performance 40nm Gate Length InSb P-Channel Compressively Strained Quantum Well Field Effect Transistors for Low-Power (Vcc=0.5V) Logic Applications," IEEE International Electron Devices Meeting, 2008, Dec. 15-17, 2008, pp. 1-4.

Dae-Hyun, K., "30 nm E-mode InAs PHEMTs for THz and Future Logic Applications," IEEE International Electron Devices Meeting, 2008, Dec. 15-17, 2008, pp. 1-4.

Sun, Y., "Scaling of In0.7Ga0.3As Buried-Channel MOSFETs," IEEE International Electron Devices Meeting, Dec. 15-17, 2008, pp. 1-4.

Radosavljevic, M., "Advanced High-K Gate Dielectric for High-Performance Short-Channel In0.7Ga0.3As Quantum Well Field Effect Transistors on Silicon Substrate for Low Power Logic Applications," 2009 IEEE International Electron Devices Meeting (IEDM), Dec. 7-9, 2009, pp. 1-4.

Ko, H. et al., "Ultrathin compound semiconductor on insulator layers for high-performance nanoscale transistors," Nature, Nov. 11, 2010, vol. 468, pp. 286-289.

Radosavljevic, M., "Non-Planar, Multi-Gate InGaAs Quantum Well Field Effect Transistors with High-K Gate Dielectric and Ultra-Scaled Gate-to-Drain/Gate-to-Source Separation for Low Power Logic Applications," 2010 IEEE International Electron Devices Meeting (IEDM), Dec. 6-8, 2010, pp. 6.1.1-6.1.4.

Trinh, H.D., et al., "Electrical Characterization of $Al_2O_3$/n-InAs Metal-Oxide-Semiconductor Capacitors With Various Surface Treatments," IEEE Electron Device Letters, Jun. 2011, pp. 3 pages, vol. 32, No. 6.

Radosavljevic, M., "Electrostatics Improvement in 3-D Tri-gate Over Ultra-Thin Body Planar InGaAs Quantum Well Field Effect Transistors with High-K Gate Dielectric and Scaled Gate-to-Drain/Gate-to-Source Separation," 2011 IEEE International Electron Devices Meeting (IEDM), Dec. 5-7, 2011, pp. 33.1.1-33.1.4.

Heyns, M. et al., "Advancing CMOS beyond the Si roadmap with Ge and III/V devices," 2011 IEEE International Electron Devices Meeting (IEDM), Dec. 5-7, 2011, pp. 13.1.1-13.1.4.

Oxland, R. et al., "An Ultralow-Resistance Ultrashallow Metallic Source/Drain Contact Scheme for III-V NMOS," IEEE Electron Device Letters, Apr. 2012, pp. 501-503, vol. 33, Issue 4.

Yuan, Z., "InGaSb: single channel solution for realizing III-V CMOS," 2012 Symposium on VLSI Technology (VLSIT), Jun. 12-14, 2012, pp. 185-186.

Vandal, M.J.H., et al, "Demonstration of scaled Ge p-channel FinFETs integrated on Si," 2012 IEEE International Electron Devices Meeting (IEDM), Dec. 10-13, 2012, pp. 23.5.1-23.5.4.

* cited by examiner

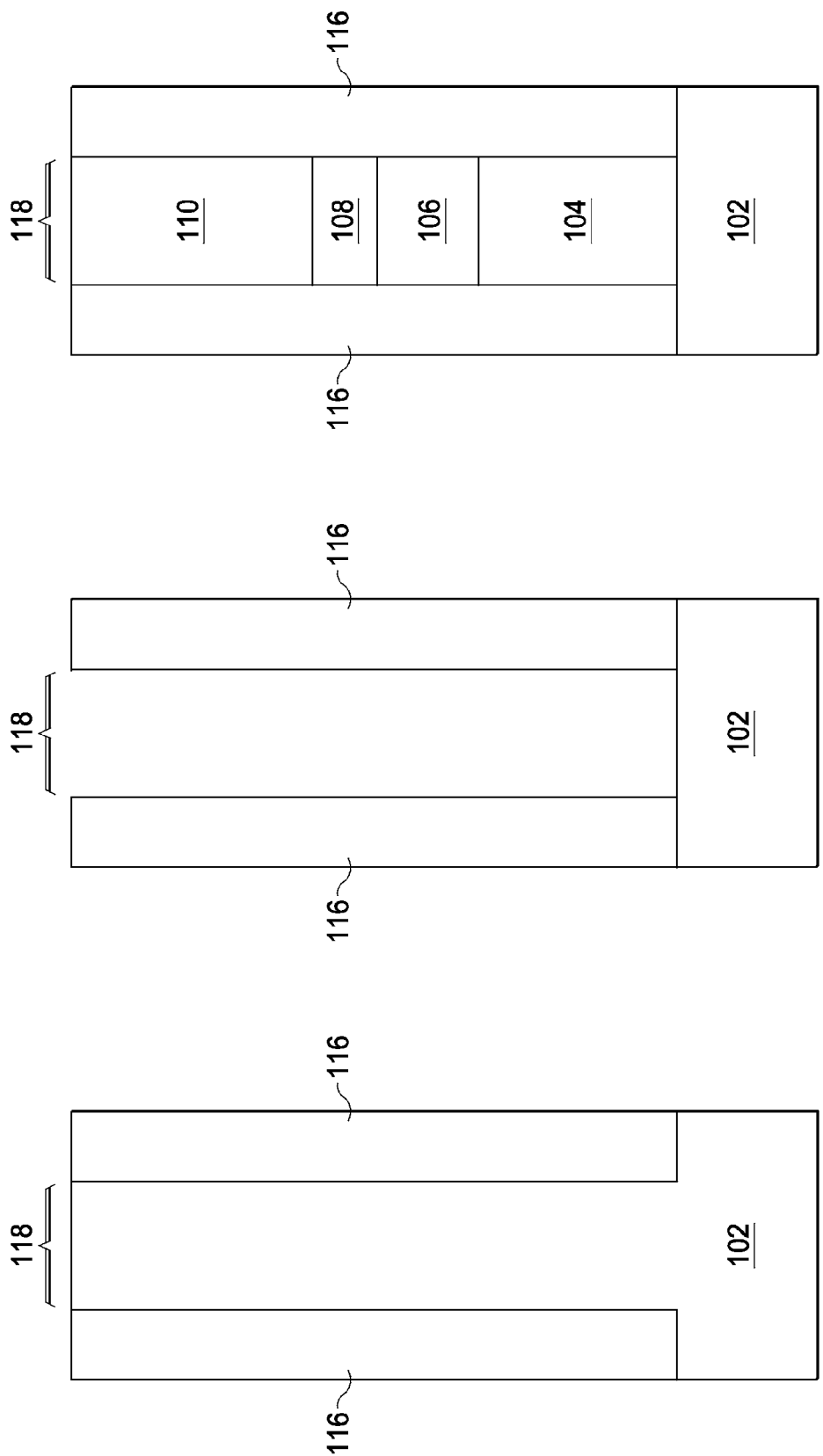

FINFET WITH CHANNEL BACKSIDE PASSIVATION LAYER DEVICE AND METHOD

BACKGROUND

As modern integrated circuits shrink in size, the associated transistors shrink in size as well. In order to operate with predictable properties, transistor production focused initially on shrinking feature size of transistors. However, as the size of transistor features has approached atomic sizes, new transistor designs have been developed. Fin field effect transistors (FinFETs) are sometimes used to replace planar metal oxide semiconductor field effect transistors (MOSFETs), enabling greater transistor packing density while maintaining predictable device performance.

Traditionally, a planar transistor such as a MOSFET has a source and drain disposed in a semiconductor, with a gate disposed on the surface of the semiconductor between the source and drain. A FinFET has a channel region in a raised fin, with the gate insulator and gate contact covering one or more sides of the fin in a channel region. A source and drain may be formed on each side of the channel region.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 1A-1D and 2A-2F are cross-sectional views of FinFET devices in intermediate steps of production according to embodiments.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the illustrative embodiments are discussed in detail below. It should be appreciated, however, that the present disclosure provides many applicable concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, and more specifically, to forming channel regions in FinFET devices. The embodiments of the disclosure may also be applied, however, to a variety of semiconductor devices. Hereinafter, various embodiments will be explained in detail with reference to the accompanying drawings.

Generally, a FinFET has a fin-shaped semiconductor region acting as a channel, with a gate insulator on one side or multiple sides of the fin to separate a gate contact from the fin. A source and drain may be formed on opposing sides of the gate to permit the gate to control the channel region of the fin between the source and drain. In some embodiments, a FinFET may have the gate insulator disposed on the three exposed sides of the fin, with the gate contact over the three fin sides to more closely control current flow through the channel under the gate contact. It has been discovered that a channel on a passivation layer reduces the likelihood that minor processing variations will degrade the switching characteristics of a FinFET. Embodiments of the channel backside passivation layer (CBPL) may be used with III-V semiconductor channel FinFETs to prevent an unpassivated channel surface and to prevent an exposed buffer layer. A III-V semiconductor channel may be formed over a buffer layer maybe formed from an aluminum-based compound, which may oxidize and create a conductive surface layer if the buffer layer extends above an adjacent structure such as an shallow trench isolation (STI) structure or a substrate. Alternatively, a buffer layer that terminates below the upper surface of an adjacent STI structure or substrate may permit the channel to form with a portion below the top surface of the adjacent STI or substrate, resulting in incomplete passivation and degraded control of the channel by the gate.

Figure 1B:
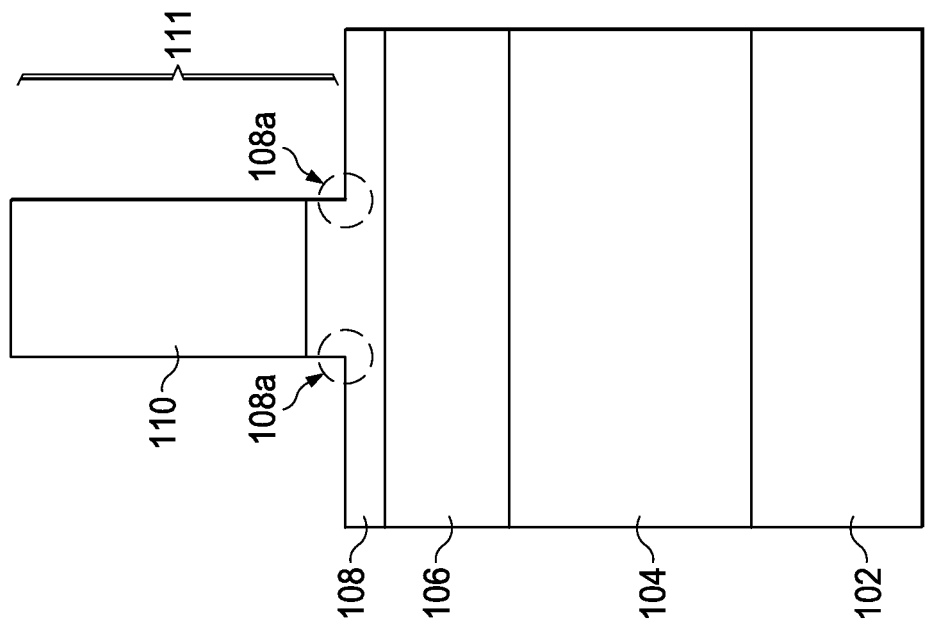
Figure 1A:
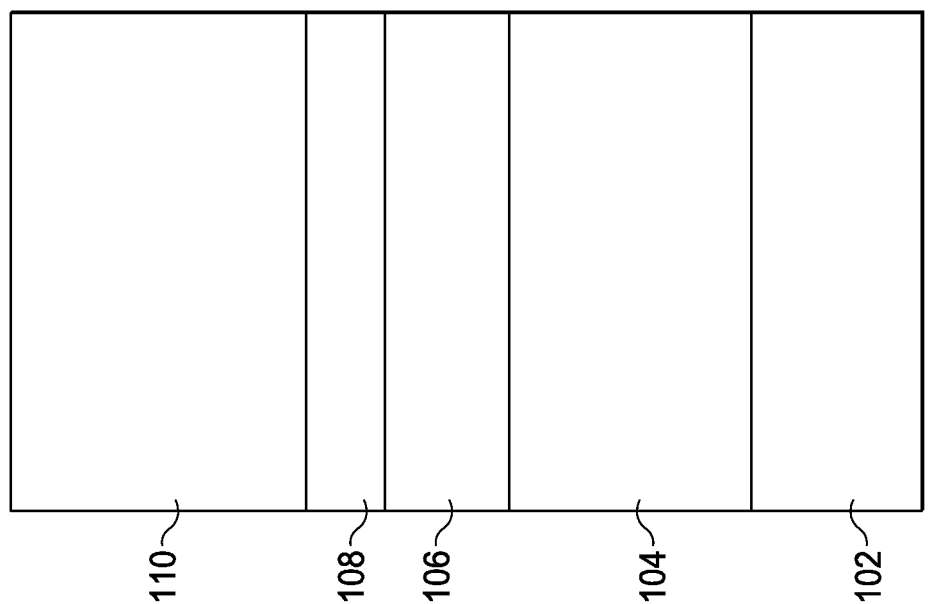

FIGS. 1A-1D illustrate cross-sectional views of a process for forming a FinFET having a CBPL according to an embodiment. FIG. 1A is a cross-sectional view of formation of a film stack on a substrate 102 for a FinFET with a channel backside passivation layer 108. A substrate 102 may have a film stack formed thereon, with the film stack comprising a template layer 104 on the substrate 102, a buffer layer 106 on the template layer 104, a CBPL 108 on the buffer layer 106 and a channel layer on the CBPL 108. The substrate 102 may, in an embodiment, be a semiconductor such as silicon, or the like, or may be an insulator, carrier wafer, or another suitable material.

The template layer 104 may be formed from a material selected to absorb any lattice mismatch between the substrate and subsequent layers. In an embodiment, the template layer 104 may be an indium-based binary compound material such as indium phosphide (InP), indium arsenide (InAs), indium antimonide (InSb), a gallium-based binary compound material such as gallium arsenide (GaAs), gallium antimonide (GaSb), or another suitable material.

The buffer layer 106 may be a material having a wide bandgap to provide electrical isolation of the channel layer 110 from the substrate 102. In an embodiment, the buffer layer 106 may be a ternary compound material such as indium aluminum arsenide (InAlAs), aluminum arsenide antimonide (AlAsSb), aluminum gallium antimonide (AlGaSb), or indium aluminum antimonide (InAlSb). In an embodiment, the buffer layer 106 may be a binary compound material such as aluminum arsenide (AlAs) or aluminum antimonide (AlSb).

The CBPL 108 may be a material that takes passivation well on exposed surfaces or that may be exposed to environmental conditions without becoming conductive. In an embodiment, a CBPL 108 may be formed from a material such as indium phosphide (InP) or gallium antimonide (GaSb). This is in contrast to the buffer layer 106, which may comprise materials that have a lower conductivity but oxidize into conductive components. For example, if the buffer layer is AlSb or AlAsSb, exposure to oxygen ($O_2$) produces $Al_2O_3$ and metallic Sb. Using an easily passivated material for the CBPL 108 permits the use of an easily oxidized, and particularly, an aluminum-based, material for the buffer layer 106. Additionally, depending on the buffer layer 106 or the feature size, the CBPL 108 may be formed of a strained material. For example, where the buffer layer 106 is AlAsSb or InAlSb, and the CBPL 108 is InP, the InP CBPL 108 may be strained due to a mismatch in lattice size. In such an embodiment, the CBPL 108 may be limited in thickness to prevent relaxation of the CBPL 108 lattice. Thus, the CBPL 108 thickness may be selected to be sufficiently thin to retain the strain induced by the buffer layer 106 to CBPL 108 interface.

The channel layer 110 may be formed on the CBPL 108 from a high-mobility material such as indium gallium arsenide (InGaAs), GaSb, InAs, indium gallium antimonide (InGaSb), or InSb. The type of material selected for the CBPL 108 may be upon, among other factors, the conductivity type of the FinFET. For example, GaSb and InGaSb, having a high hole mobility, may be used in a p-type FinFET, while InGaAs, InAs and InSb, having a high electron mobility, may be used in an n-type FinFET.

The template layer 104 may be omitted if the buffer layer 106 can be directly grown on substrate layer 102, for example, but not limited to, in an embodiment where the buffer layer 106 is a binary compound such as AlAs or AlSb. The buffer layer 106 may be omitted in an embodiment where no additional isolation is required between channel layer 110 and substrate layer 102.

In an embodiment, the template layer 104, the buffer layer 106, the CBPL 108 and the channel layer 110 may each be a blanket layer formed though blanket epitaxy methods such as molecular beam epitaxy (MBE), chemical vapor deposition (CVD), liquid-phase epitaxy (LPE) or the like. The template layer 104 may be formed with a thickness between about 20 nm and about 100 nm, and in an embodiment, the template layer 104 thickness may be about 40 nm. The buffer layer 106 may be formed with a thickness between about 10 nm and about 200 nm, and in an embodiment, the buffer layer 106 thickness may be about 100 nm. The CBPL 108 may be formed with a thickness between about 4 nm and about 20 nm, and in an embodiment, the CBPL 108 thickness may be about 10 nm. The channel layer 110 may be formed with a thickness between about 10 nm and about 40 nm, and in an embodiment, the channel layer 110 thickness may be about 20 nm.

FIG. 1B illustrates a cross-sectional view of formation of the channel region 111. The film stack may be etched so that the channel layer 110 and CBPL 108 form a fin having a gate-controlled channel region 111. In an embodiment, the channel region 111 may be formed by masking and etching through the channel layer 110 into the CBPL 108. Targeting the center of the CBPL 108 as the bottom of the etch results in greater margin during the etching process so that an etch that over- or under-etches the targeted depth does not cause a channel performance issue. In an embodiment, etching the channel region 111 creates a CBPL shoulder region 108a, with a portion of the CBPL 108 having a width substantially the same as the channel layer 110 in the channel region 111.

Figure 1D:
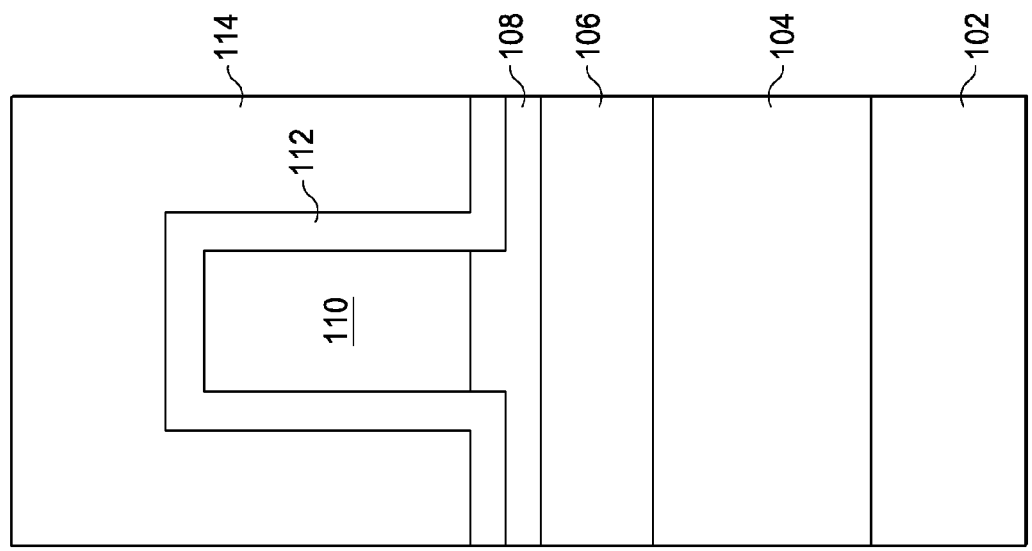
Figure 1C:
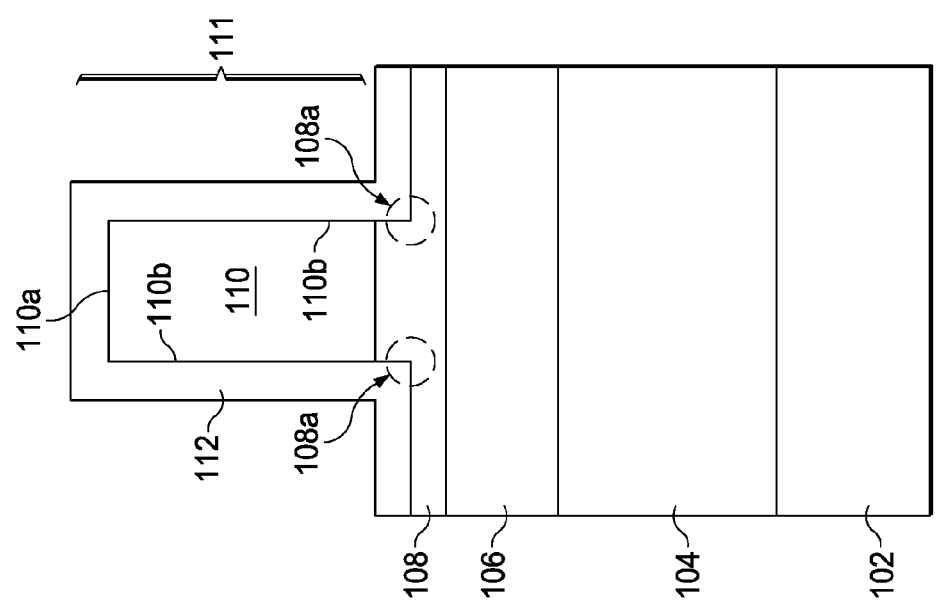

FIG. 1C illustrates a cross-sectional view of formation of a gate insulator layer 112. The gate insulator layer 112 may be comprised of an optional interfacial control layer (ICL) and a gate dielectric. In one embodiment, the gate insulator layer 112 will be a high-k layer, and may be an oxide such as hafnium oxide ($HfO_2$), zirconium dioxide ($ZrO_2$), tantalum silicon oxide ($TaSiO_x$), a thermal oxide, a nitride, or the like, or may be a combination comprising one or more the foregoing.

The gate insulator layer 112, in an embodiment, contacts the sidewall of the CBPL shoulder region 108a, and contacts the top surface and sidewalls of the channel layer 110. The gate insulating layer 112 passivates the channel layer 110 and CBPL 108 while avoiding contact with the buffer layer 106. Additionally, the gate insulating layer 112 insulates the gate contact (FIG. 1D, 114) from the channel layer 110.

FIG. 1D illustrates a cross-sectional view of a formation of a gate contact 114. The gate contact 114 may be a conductive material such as a metal or a poly-silicon. Gate spacers, a source/drain, protective layers or the like may also be formed before or after the layer stack is formed.

Figure 2F:
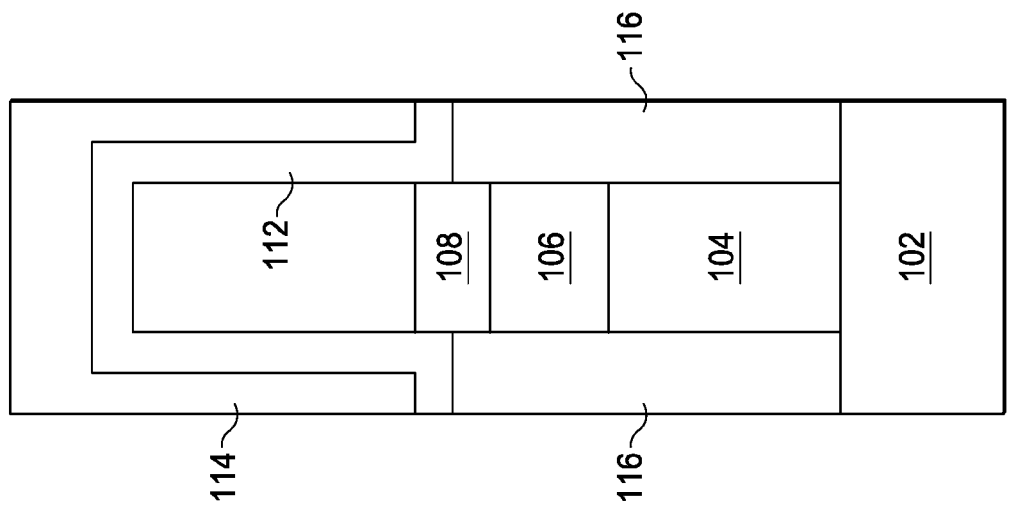

FIGS. 2A-2F illustrates cross-sectional views of a process for forming a FinFET having a CBPL according to another embodiment. FIG. 2A illustrates a cross-sectional view of formation of STIs 116 for a FinFET. A fin region 118 may be masked and the substrate 102 etched to a predetermined depth, then STIs 116 created by filling the etched region with a barrier material such as an oxide. The STIs 116 isolate adjacent FinFETs from each other, preventing current from flowing through the substrate 102 between adjacent structures and reducing or preventing cross-talk.

FIG. 2B illustrates a cross-sectional view of etching back the fin region 118. In an embodiment, the substrate 102 may be selectively etched back to create an opening in the fin region 118 for formation of a layer stack. In such an embodiment, the STIs 116 may act as a mask for the etching of the fin region 118.

FIG. 2C illustrates a cross-sectional view of formation of a layer stack in the fin region 118. A template layer 104 may be formed on the substrate 102, an buffer layer 106 may be formed on the template layer 104, a CBPL 108 may be formed on the buffer layer 106 and a channel layer may be formed on the CBPL 108. The layers may be formed through deposition, such as CVD. Epitaxial layers in narrow trenches may, in an embodiment, be formed by aspect ratio trapping (ART). In an embodiment, the layers may be formed of materials and to thicknesses described above.

ART may be useful in an embodiment where layers are formed in an enclosed trench, and may permit the layers to be formed with reduced crystalline dislocations or structural defects. ART takes advantage of the tendency for defects in epitaxially grown III-V semiconductor layers to propagate along a crystalline plane. The crystalline planes in a III-V semiconductor tend to be at an angle to the crystalline surface, and defects are propagated towards the edge of the deposited layer before the defect migrates to the top surface of the layer. Thus, all of the defects are absorbed at the sides of the layer instead of migrating to the top of the layer, resulting in a top layer surface with fewer defects. In order to effectively employ ART, the aspect ratio, or the ratio of the height to the width will be selected to cause any defects to terminate at the sides of the layer instead of the top surface.

Figure 2E:
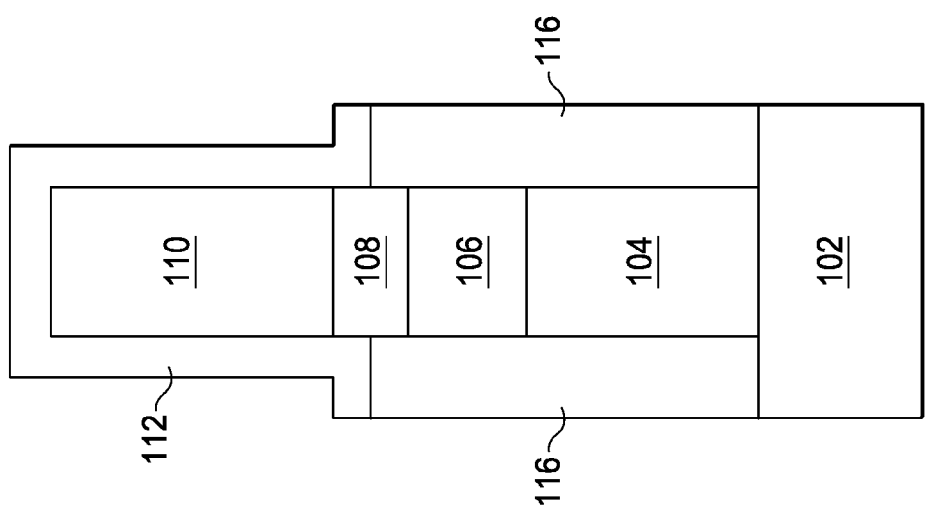
Figure 2D:
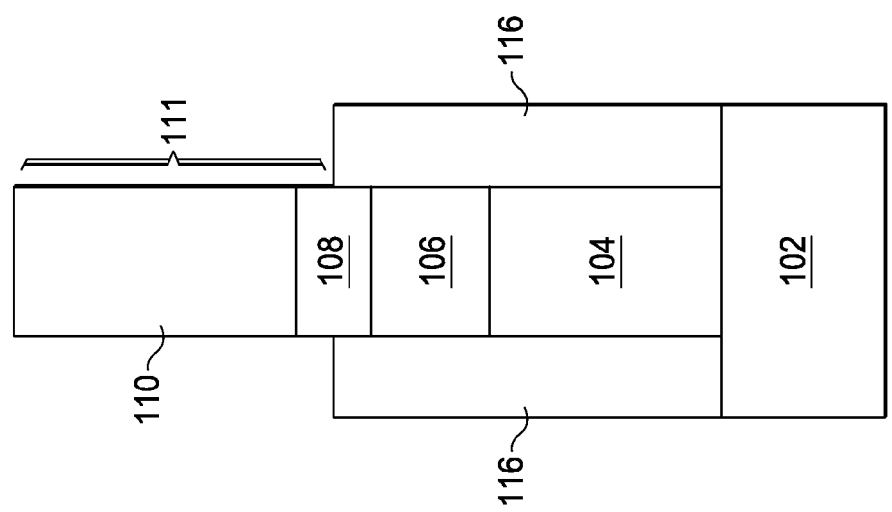

FIG. 2D is a cross-sectional view of etching of the STIs 116 and exposure of the channel region 111. In an embodiment, the STIs 116 may be selectively etched, or exposed by a mask and etched to reduce the height of the STIs 116 and expose the channel layer 110 and a portion of the CBPL 108. The STIs 116 may be etched to a depth resulting in a top surface of the STIs 116 being disposed at about half the height of the CBPL 108. Etching the STIs 116 back to expose only a portion of the CBPL 108 creates a margin where variations in processing, whether through etching of the STIs 116, or formation of one or more of the layers, may vary without exposing the buffer layer 106 or leaving the bottom surface of the channel layer 110 below the STI 116 top surface. In an embodiment, the STIs 116 rise above the top surface of the buffer layer 106 and, with the CBPL 108, enclose the buffer layer 106 and shield the buffer layer 106 from oxidation.

FIG. 2E illustrates a cross-sectional view of formation of a gate insulator layer 112. The gate insulator layer 112 may be formed using the processes and materials as described above. In an embodiment, the gate insulator layer 112 may be formed to overlie the top surfaces of the STIs 116, and may extend in a continuous layer to cover or contact a portion of the sidewalls of the CBPL 108. The gate insulator layer 112 may also cover or contact the sidewalls and top surface of channel layer 110 while avoiding the buffer layer 106. The STI may rise above the top surface of the buffer layer 106 and prevent the gate insulator layer 112 from contacting the buffer layer 106.

FIG. 2F illustrates a cross-sectional view of a formation of a gate contact 114. The gate contact may be a conductive material such as a metal or a poly-silicon. Gate spacers, a source/drain, protective layers or the like may also be formed before or after the layer stack is formed.

Figure 3:
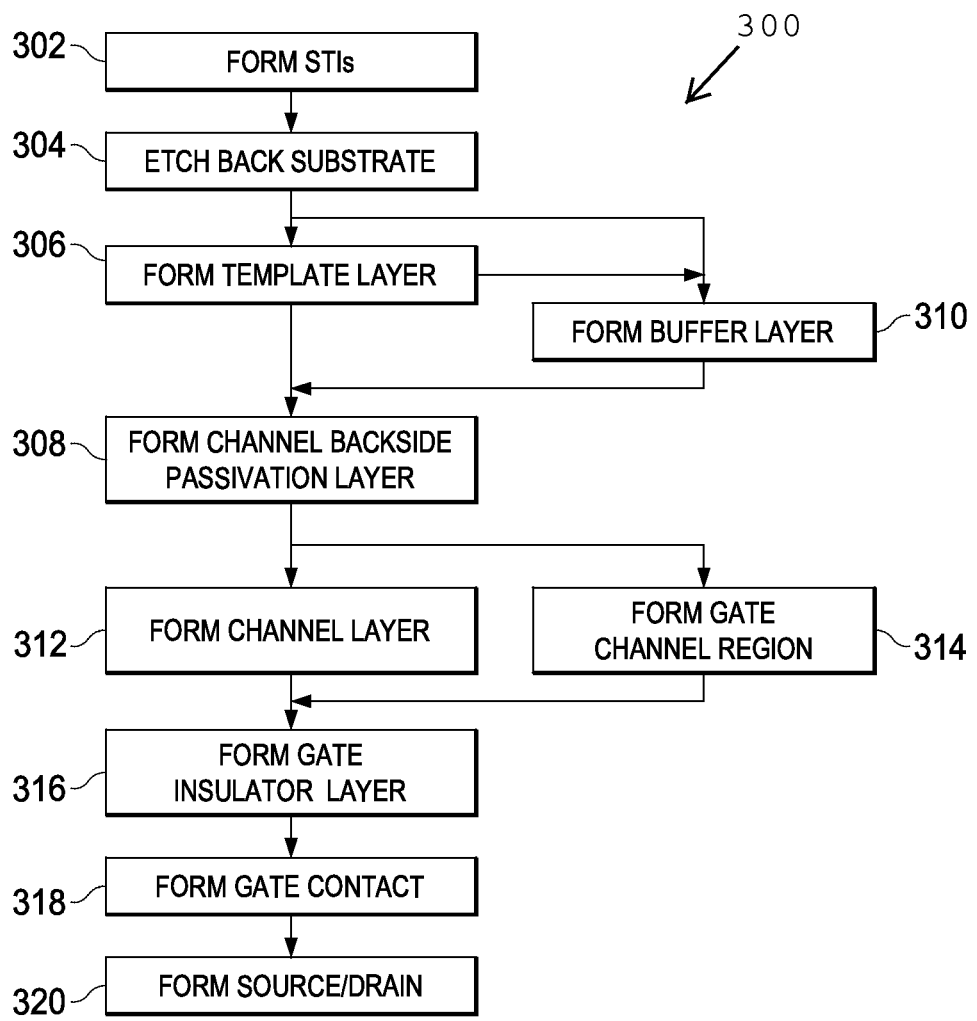
FIG. 3 is a flow diagram of a method for forming a FinFET device according to an embodiment.

FIG. 3 is a flow diagram illustrating a method 300 of forming a FinFET device with a CBPL according to an embodiment. In an embodiment, STIs may optionally be formed in block 302, and in block 304, the substrate may optionally be etched back between the STIs to form the fin region. A template layer may be formed in block 306, with the template layer formed as a blanket layer in an embodiment, or formed in a fin region between STIs in embodiments where the fin region and STIs are employed. A buffer layer may be formed over the template layer in block 310. A CBPL may be formed in block 308 over the buffer layer in embodiments where the buffer layer is employed, or otherwise, over the template layer. A channel layer is formed in block 312. In block 314, a gate channel region may be formed by a fin etch process in an embodiment where the layer stack is blanket formed without the STI formation, and may be formed by STI etch back in an embodiment with STIs. A gate insulator layer may be formed in block 316, with the gate insulator layer optionally comprising forming an ICL and a gate dielectric layer. A gate contact may be formed in block 318 and source/drain regions formed in block 320.

Thus, in an embodiment, a device may comprise a template layer disposed on a substrate and a buffer layer disposed over the template layer. A channel backside passivation layer may be disposed over the buffer layer and a channel layer disposed over the channel backside passivation layer. A gate insulator layer may be disposed over and in contact with the channel layer and the channel backside passivation layer. The channel backside passivation layer may separate the buffer layer from the gate insulator layer. The buffer layer may optionally comprise aluminum, and the channel backside passivation layer may optionally comprise one of indium phosphide and gallium antimonide. The channel layer may optionally comprise a III-V semiconductor compound. STIs may be disposed on opposite sides of the channel backside passivation layer, and the channel layer may be disposed above a top surface of the STIs. The channel backside passivation layer may have a top surface disposed above the top surface of the STIs and a bottom surface disposed below the top surface of the STIs. The channel backside passivation layer may be a blanket layer and comprise a shoulder region and the gate insulator layer may be in contact with a sidewall of the shoulder region.

In an embodiment, a method of forming a device comprises forming a template layer over a substrate, forming a buffer layer over the template layer and forming a channel backside passivation layer over the buffer layer. A channel layer may be formed over the channel backside passivation layer, with the channel backside passivation layer separating the channel layer from the buffer layer. A channel region may be formed, the channel region having the channel layer and at least a portion of the channel backside passivation layer disposed therein. A gate insulation layer may be formed over the channel region. The gate insulation layer may be formed in contact with a sidewall and a top surface of the channel layer and in contact with at least a portion of a sidewall of the channel backside passivation layer. STIs may be formed in the substrate and etching back the substrate between the STIs to form a fin region, wherein the channel backside passivation layer and the channel layer are formed between the STIs and in the fin region. The STIs may be etched back to have a height where the sidewalls of the channel layer and at least a portion of the sidewalls of the channel backside passivation layer are exposed. The channel layer and the channel backside passivation layer may each be formed as a blanket layer. Forming the gate insulation layer may optionally comprise forming an interface control layer in contact with the channel layer. The channel layer may comprise a III-V semiconductor, the buffer layer may comprise at least aluminum, and the channel backside passivation layer may comprise one of indium phosphide and gallium antimonide.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device, comprising:
   a buffer layer disposed over a substrate;
   a template layer disposed over the substrate;
   a channel backside passivation layer disposed over the buffer layer;
   a channel layer disposed over the channel backside passivation layer, wherein the channel backside passivation layer has an upper portion and a lower portion;
   a gate insulator layer disposed over and in contact with the channel layer and the channel backside passivation layer, the channel backside passivation layer separating the buffer layer from the gate insulator layer, and wherein the gate insulator layer is in contact with a sidewall of the upper portion; and
   shallow trench isolation structures (STIs) disposed on opposite sides of the channel backside passivation layer, the buffer layer, and the template layer, wherein the channel layer is disposed above a topmost surface of the STIs, the channel backside passivation layer having a topmost surface disposed above the topmost surface of the STIs and having a bottommost surface disposed below the topmost surface of the STIs, and wherein a bottommost surface of the STIs contacts the topmost surface of the substrate and the topmost surface of the STIs contacts a bottommost surface of the gate insulator layer.

2. The device of claim 1, wherein the buffer layer comprises aluminum.

3. The device of claim 2, wherein the channel backside passivation layer comprises a material selected from the group consisting of indium phosphide and gallium antimonide.

4. The device of claim 3, wherein the channel layer comprises a III-V semiconductor compound.

5. The device of claim 1, further comprising a template layer disposed between the substrate and the buffer layer.

6. The device of claim 1, wherein the channel layer is disposed in a fin;
and wherein a top portion channel backside passivation layer extends into the fin.

7. A device, comprising:
a fin extending from a substrate, the fin having a channel region;
a channel layer disposed in the channel region;
a buffer layer disposed under the channel layer;
a channel backside passivation layer disposed between the channel layer and the buffer layer;
a gate insulator layer disposed over and in contact with the channel layer and a first portion of the channel backside passivation layer, wherein the gate insulator layer is in contact with a sidewall of the channel backside passivation layer; and
shallow trench isolation structures (STIs) extending from a topmost surface of the substrate to a bottommost surface of the gate insulator and contacting sidewalls of the buffer layer and the channel backside passivation layer, wherein the topmost surface of the STIs are below a topmost surface of the channel backside passivation layer and above a bottommost surface of the channel backside passivation layer.

8. The device of claim 7, wherein the channel backside passivation layer has a thickness between about 4 nm and about 20 nm.

9. The device of claim 7, wherein the channel layer has a thickness between about 10 nm and about 40 nm.

10. The device of claim 7, wherein the buffer layer has a thickness between about 10 nm and about 200 nm.

11. The device of claim 7, further comprising a template layer disposed between a substrate and the buffer layer.

12. A device, comprising:
a channel layer disposed in a fin over a substrate;
a buffer layer disposed under the channel layer and under the fin, the buffer layer comprising a first material;
a channel backside passivation layer disposed between the channel layer and the buffer layer, wherein a first portion of the channel backside passivation layer extends into the fin;
a gate insulator layer disposed over and in contact with the channel layer and the first portion of the channel backside passivation layer;
a gate electrode disposed over the gate insulator layer;
wherein the first material comprises an electrically insulating material; and
shallow trench isolation structures (STIs) disposed on sidewalls of the fin, the STIs extending continuously from the substrate to the gate insulator and contacting sidewalls of the buffer layer and the channel backside passivation layer, wherein a topmost surface of the STIs is above a bottommost surface of the channel backside passivation layer and below a topmost surface of the channel backside passivation layer.

13. The device of claim 12, wherein the first material is a compound that generates a conductive component upon oxidation.

14. The device of claim 13, wherein the compound comprises aluminum.

15. The device of claim 12, wherein the gate insulator layer extends below a top surface of the channel backside passivation layer.

* * * * *